(12) United States Patent
Kumar (10) Patent No.: US 10,885,430 B2
(45) Date of Patent: Jan. 5, 2021

(54) NON-BOOLEAN ANALOG MOTT MEMRISTOR NETWORK (71) Applicant: Hewlett Packard Enterprise Development LP, Houston, TX (US)

(72) Inventor: Suhas Kumar, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 708 days.

(21) Appl. No.: 15/664,058

(22) Filed: Jul. 31, 2017

(65) Prior Publication Data

US 2019/0034789 A1    Jan. 31, 2019

(51) Int. Cl.
*G06N 3/063* (2006.01)
*H01L 45/00* (2006.01)
*G06G 7/122* (2006.01)
*H01L 49/00* (2006.01)

(52) U.S. Cl.
CPC ........... *G06N 3/0635* (2013.01); *G06G 7/122* (2013.01); *H01L 45/04* (2013.01); *H01L 49/003* (2013.01)

(58) Field of Classification Search
CPC ....... G06N 3/0635; G06F 7/122; H01L 45/04; H01L 49/003
USPC .......................................................... 708/802
See application file for complete search history.

(56) References Cited

U.S. PATENT DOCUMENTS

| | | | | |
|---|---|---|---|---|
| 10,153,729 B2 * | 12/2018 | Kumar | ...................... | H03B 7/06 |
| 10,497,872 B2 * | 12/2019 | Kumar | .................... | H01L 47/00 |
| 10,541,274 B2 * | 1/2020 | Yi | ........................... | G11C 11/54 |
| 2006/0271342 A1 | 11/2006 | Farhat et al. | | |
| 2012/0249252 A1 * | 10/2012 | Borghetti | ................. | H03B 7/00 331/132 |
| 2014/0214738 A1 | 7/2014 | Pickett | | |
| 2017/0098155 A1 | 4/2017 | Lepage et al. | | |

FOREIGN PATENT DOCUMENTS

| | | |
|---|---|---|
| EP | 2133829 | 1/2014 |
| WO | 2016/072964 A1 | 5/2016 |

OTHER PUBLICATIONS

Williams et al., "OSTP Nanotechnology-Inspired Grand Challenge: Sensible Machines" (extended version 2.5), IEEE Rebooting Computing, ITRS, Oct. 20, 2015, 31 pages.
Matthew D. Pickett et al: "A scalable neuristor built with Mott memristors (w/ supplementary information)", Nature Materials, vol. 12, No. 2, Dec. 16, 2012 (Dec. 16, 2012), pp. 114-117.

(Continued)

*Primary Examiner* — Tan V Mai
(74) *Attorney, Agent, or Firm* — Michael A. Dryja (57) ABSTRACT

A non-Boolean analog system includes a first Mott memristor having a first value of a characteristic, and a second Mott memristor having a second value of the characteristic different than the first value. The system includes a resistance in series with the first and second Mott memristors to form a network having a capacitance and that is operable as a relaxation oscillator. Responsive to electrical excitation, a temperature of the network operating an environment including ambient thermal noise settles at an equilibrium corresponding to a global minimum that is a maximally optimal global solution to a global optimization problem to which the network corresponds.

19 Claims, 4 Drawing Sheets

(56) References Cited

OTHER PUBLICATIONS

Extended European Search Report and Search Opinion Received for EP Application No. 18186634.4, dated Feb. 13, 2019, 6 pages.
Esmaeilzadeh et al., "Dark silicon and the end of multicore scaling", Proceedings of the 38th annual international symposium on Computer architecture, 2011, pp. 365-376.
Dambre et al., "Information Processing Capacity of Dynamical Systems", Scientific Reports, vol. 2, Article No. 514, 2012, 7 pages.
Bertschinger et al., "Real-Time Computation at the Edge of Chaos in Recurrent Neural Networks", Neural Computation, vol. 16, Issue 7, Jul. 2004, pp. 1413-1436.
Molnar, B. et al., "Asymmetric Continuous-time Neural Networks Without Local Traps for Solving Constraint Satisfaction Problems", PLoS ONE 8(9), Sep. 16, 2013, online < http://journals.plos.org/plosone/article?id=10.1371/journal.pone.0073400 >.
Andras, H. et al., "Solving Non-topographic Problems with Topographic and Synchronization Algorithms and Architectures", 2012, online https://itk.ppke.hu/uploads/articles/163/file/Horvath_A_diss_doi.pdf >.
Okobiah, O., "Geostatistical Inspired Metamodeling and Optimization of Nanoscale Analog Circuits", Dissertation—University of North Texas, May 2014, online < https://digital.library.unt.edu/ark:/67531/metadc500074/m2/1/high_res_d/dissertation.pdf >.
Karunaratne, D.K., "Nano-magnetic Devices for Computation", Jan. 2013, online < http://scholarcommons.usf.edu/cgi/viewcontent.cgi?article=5713&context=etd >.
Sharad, M. et al., "Energy-efficient Non-boolean Computing with Spin Neurons and Resistive Memory", IEEE Transactions on Nanotechnology, vol. 13, No. 1, Jan. 1, 2014, online < http://ieeexplore.ieee.org/document/6637128/ >.
Mishra, A.K. et al., "iACT: A:Software-hardware Framework for Understanding the Scope of Approximate Computing", Mar. 2, 2014, WACAS '14, online < https://sampa.cs.washington.edu/wacas14/papers/mishra.pdf >.
Sumi, R. et al., "Robust Optimization with Transiently Chaotic Dynamical Systems", IOPScience, May 19, 2014, online http://iopscience.iop.org/article/10.1209/0295-5075/106/40002/meta >.

\* cited by examiner

NON-BOOLEAN ANALOG MOTT MEMRISTOR NETWORK

BACKGROUND

Modern computing systems are typically digital computing systems. In a digital computing system, data is usually representable as one of two values, such as logic zero and logic one. Such digital computing systems can be referred to as Boolean computing systems.

DETAILED DESCRIPTION

As noted in the background section, computing systems are typically Boolean digital computing systems in which data is representable as one of two values. Processors of such computing systems have exponentially increased in computing power since their advent. Digital computing processors employ large numbers of transistors, and increases in raw computing power have resulted from ever-shrinking transistor size. It is widely postulated, however, that further increases in such computing power will slow or cease, because physical limits as to how small a transistor can be fabricated are being reached.

As digital computing systems have increased in power, they have been used to solve computationally difficult problems. One set or class of problems, however, has proven to be difficult to solve via digital computing. This set of problems is known as the non-deterministic polynomial-time (NP)-hard or NP-complete set of problems. Mathematically, a problem H is in the NP set or class when every problem in L in NP can be reduced in polynomial time to H. It is suspected that there are no polynomial-time algorithms of the type by which a digital computing system can be programmed to yield complete solutions for NP problems.

An example of an NP-hard problem is a global optimization problem. A global optimization problem has a global minimum that is the maximally optimal global solution to the problem, as well as one or more local minima that can appear to be solutions but in actuality are not maximally optimal. To attempt to solve a global optimization problem using a digital computing system, a large number of iterations of an approximating solving algorithm is run from different starting points, with the lowest determined solution presumed as the global minimum that is the actual maximally optimal solution to the problem.

However, there is no guarantee that the lowest determined solution is indeed the global minimum and thus the actual solution to the global optimization problem, since the problem is NP hard. As such, digital computing systems are theoretically unable to provide a complete solution to a global optimization problem. Running a large number of iterations of the algorithm can yield a lowest determined solution that has a given likelihood to be the actual solution within a confidence level, with increasing (but never complete) confidence realized in correspondence with the number of iterations run. Since the raw computing power of digital computing systems is unlikely to improve greatly in the future, though, there is no guarantee that vastly higher confidence levels will be achieved for solutions to particularly difficult global optimization problems.

Disclosed herein are techniques to solve a global optimization problem by determining a global minimum that is the maximally optimal global solution to the problem. The techniques leverage non-Boolean analog computing. A computing system is non-Boolean when data is representable as one of more than two values; a computing system is analog when data is representable as one of a potentially infinite number of values along a continuum.

The techniques disclosed herein particularly leverage a non-Boolean analog Mott memristor network. A Mott insulator is a material that conducts electricity under conventional band theories, but are insulators when measured at low temperatures. A Mott memristor contains a Mott insulator and is also a memristor, which is a non-linear passive two-terminal electrical component that relates electrical charge with magnetic flux linkage. When a Mott memristor network corresponding to a global optimization problem is run or simulated in an environment including ambient thermal noise, the temperature of the network settles at an equilibrium corresponding to a global minimum that is the maximally optical global solution to the problem.

Figure 1:
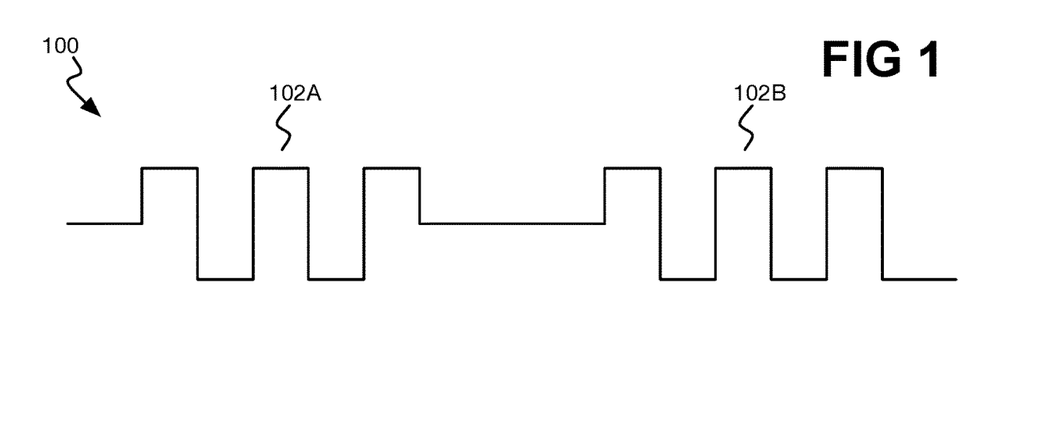
FIG. 1 is a diagram of an example non-Boolean analog network that can be modeled in correspondence with a global optimization problem.

FIG. 1 shows an example non-Boolean analog network 100 that can be modeled in correspondence with a global optimization problem for subsequent simulation to provide a maximally optimal global solution to the problem. The network 100 includes two Mott memristors 102A and 102B, collectively referred to as the Mott memristors 102. The Mott memristors 102 are in series with one another.

Each Mott memristor 102 can be a non-via niobium oxide ($NbO_x$, where x is or approximates two) memristor. The memristors 102, however, differ from one another in that they have different values for at least one characteristic. The characteristic can be a physical characteristic, such as area or size, or an electrical characteristic, such as the resistance or current at which negative differential resistance occurs. The characteristic values for the memristors 102 are selected so that the corresponding network 100 corresponds to a global optimization problem to be solved. For example, one way to program the network 100 is by changing the ambient temperature of the different memristors 102 such that the energy profile of each undergoes a change depending on the applied temperature.

Each Mott memristor 102 can be modeled as a quasi-static conduction equation, in which temperature is a state variable of the equation. An example of such a quasi-state conduction equation is a modified three-dimensional Poole-Frenkel transport relation. Such a relation can be expressed mathematically as:

$$i_m = \left[ A \left\{ \left( \frac{k_B T}{\omega \sqrt{v_m}} \right)^2 \left( 1 + \left( \frac{\omega \sqrt{v_m}/d}{k_B T} - 1 \right) \cdot \frac{2 \times 10^4 e^{-(0.301/k_B T)}}{e^{\frac{\omega \sqrt{v_m}/d}{k_B T}}} \right) + \frac{1}{2d} \right\} \right] v_m. \quad (1)$$

In equation (1), $i_m$ and $v_m$ are the current through the modeled memristor 102 and the voltage over this memristor 102, respectively. Furthermore, $\omega$ is a constant equal to $2.6 \times 10^{-24}$; A is the lateral device area of the modeled memristor 102; d is the thickness of the niobium oxide layer of the memristor 102; $k_B$ is the Boltzmann constant, which is $8.617 \times 10^{-5}$ electron-volts (eV); and T is the temperature of the memristor 102 in kelvin (K).

The temperature dynamics of each Mott memristor 102 can be modeled so that its temperature dynamics relate to electrical power dissipation and thermal properties thereof by Newton's law of cooling. Newton's law of cooling can be expressed mathematically as:

$$\frac{dT}{dt} = \frac{i_m v_m}{C_{th}} - T - \frac{T_{amb}}{C_{th} R_{th}(T)} + \eta(t). \quad (2)$$

In equation (2), $T_{amb}$ is the ambient temperature of the environment in which the network 100 is operating, such as 300 K; $C_{th}$ is the thermal capacitance of the modeled memristor 102, such as $10^{-16}$ watt-seconds per K (Ws/K); and $R_{th}$ is the temperature-dependent effective thermal resistance of the memristor 102. Furthermore, the approximation n(t) can be $$\sqrt{T \left( \frac{k_B}{C_{th}} \right)} \frac{4\pi}{R_{th} C_{th}} \cos \left( \frac{2\pi}{R_{th} C_{th}} \right).$$

The physical differences between the Mott memristors 102 of the network 100 can then be heuristically modeled using a temperature-coupled equation. An example of such an equation is:

$$R_{th}(T) = R_{th}(T_0) + J_1 \text{erf}\left( \frac{T - T_{C1}}{0.3} + 1 \right) + J_2 \text{erf}\left( \frac{T - T_{C2}}{0.3} + 1 \right). \quad (3)$$

In equation (3), $R_{th}(T)$ is the thermal resistance of the network 100 as a whole at temperature T; $R_{th}(T_0)$ is the thermal resistance of the network 100 at an initial temperature $T_0$; and $J_1$ and $J_2$ are two jumps (J) in $R_{th}$ at respective temperatures $T_{c1}$ and $T_{c1}$, where each jump represents a Mott transition of the memristors 102. Furthermore, erf(●) is an error function to smooth the jumps in $R_{th}$. An example error function is the Gauss error function, which is of sigmoid shape. In equations (1), (2), and (3), the temperature T can be considered a state variable.

Figure 2A:
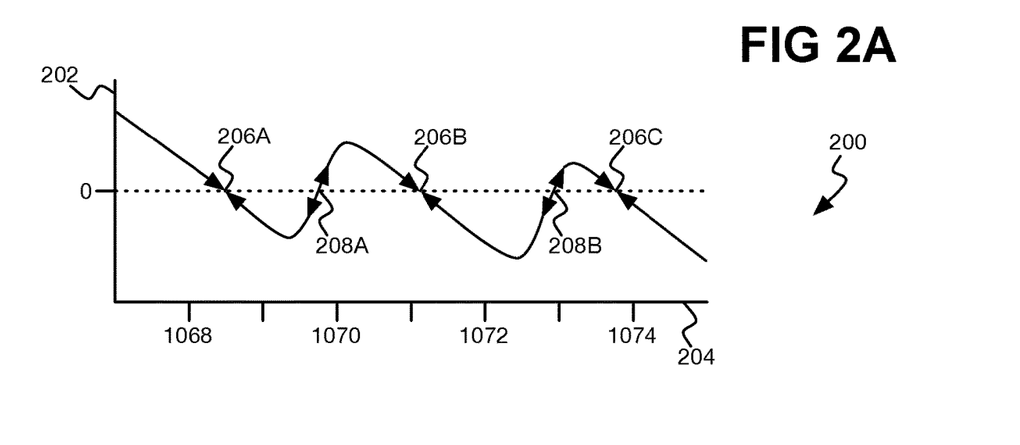
FIGS. 2A and 2B are diagrams of an example plot of the derivative of the temperature of the network of FIG. 1, and an example plot of the negative integral of this derivative, respectively.
Figure 2B:
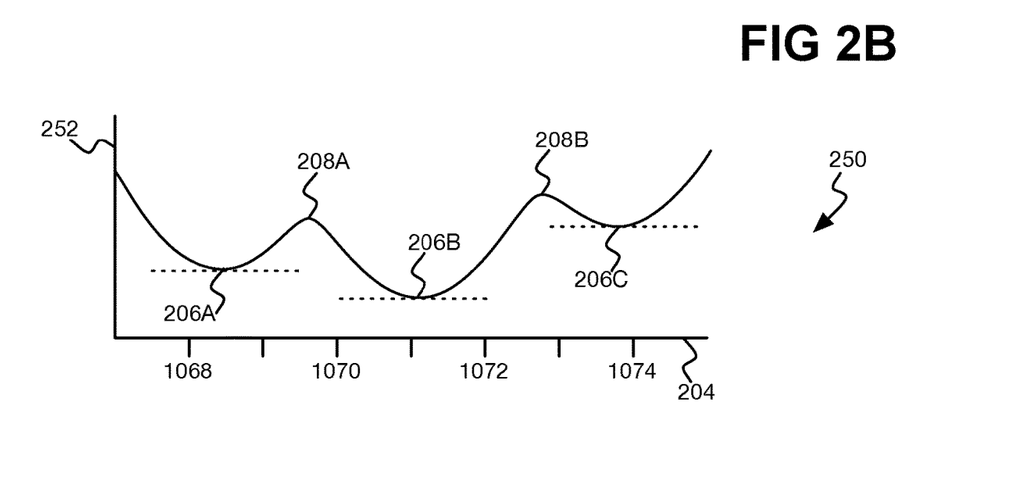

FIG. 2A shows an example plot 200 of the derivative dT/dt in units of K/nanosecond (K/ns) along the y-axis 202 versus T in units K along the x-axis 204 that is obtained by solving equation (3) using equations (2) and (1). FIG. 2B shows an example plot 250 of the negative integral $$-\int \frac{dT}{dt} dT$$

of equation (3) along the y-axis 252 in units of $K^2$/picosecond ($K^2$/ps), which is the differential equation in T. This negative integral is the quantity—a smooth non-convex function—that is minimized to obtain a most optimal (i.e., most stable) steady-state solution of equation (3). Therefore, it corresponds to a potential energy landscape of the network 100 of FIG. 1, although it is not a measure of energy.

In FIGS. 2A and 2B, there are three stable equilibria 206A, 206B, and 206C, which are collectively referred to as the stable equilibria 206. The equilibria 206 are stable because any slight perturbation of the network 100 once any equilibrium 206 has been reached results in the network 100 again settling at the equilibrium 206 in question. The equilibria 206A and 206C are local minima of the plot 250 of FIG. 2B, whereas the equilibrium 206B is a global minimum of the plot 250. The local minimum of each equilibria 206A and 206B corresponds to a non-maximally optimal, local solution to the global optimization problem to which the network 100 of FIG. 1 corresponds. By comparison, the global minimum of the equilibrium 206B corresponds to a maximally optimal global solution to the global optimization problem.

Furthermore, in FIGS. 2A and 2B, there are two unstable equilibria 208A and 208B, which are collectively referred to as the unstable equilibria 208. The equilibria 208 are unstable because any slight perturbation of the network 100 of FIG. 1 once any equilibrium 208 has been reached does not in the network 100 again settling at the equilibrium 208 in question. Rather, any slight perturbation of the network 100 once any equilibrium 208 has been reached results in the network 100 settling at one of the stable equilibria 206.

Figure 3A:
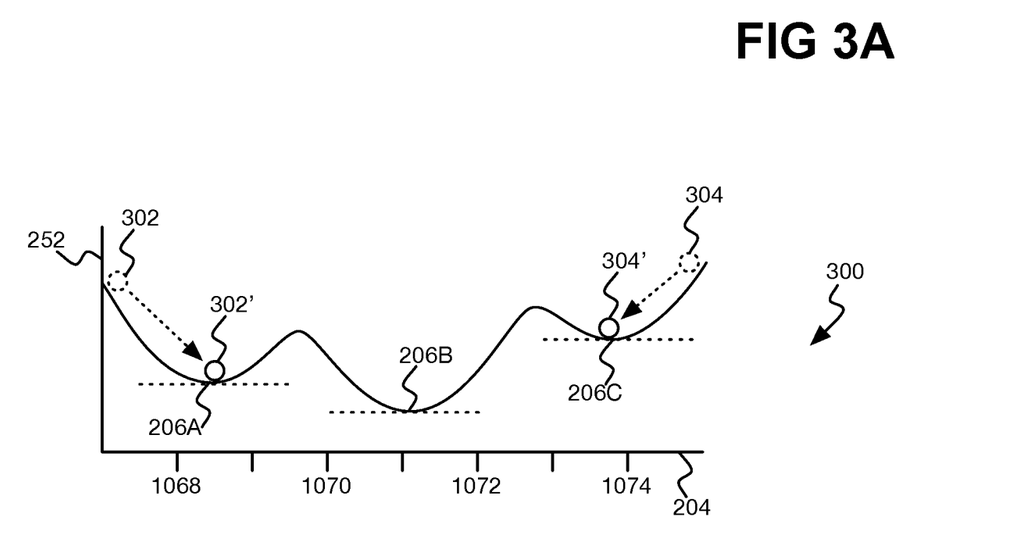
FIGS. 3A and 3B are diagrams of example plots of simulation of the network of FIG. 1 in the absence and presence of ambient thermal noise, respectively.
Figure 3B:
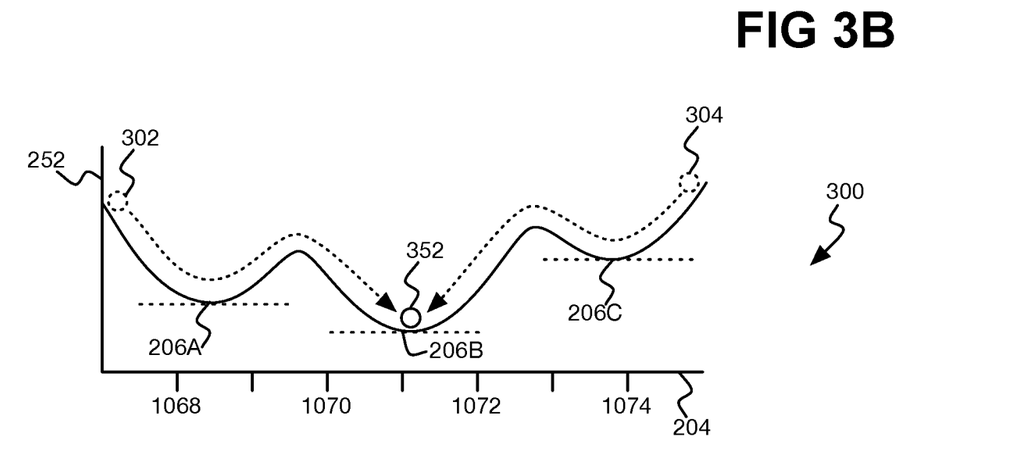

FIG. 3A shows an example plot 300 of the negative integral $$-\int \frac{dT}{dt} dT$$

along the y-axis 252 versus T in units K along the x-axis 204 that corresponds to two simulations of the state variable T in the absence of ambient thermal noise. FIG. 3B shows an example plot 350 of the negative integral $$-\int \frac{dT}{dt} dT$$

along the y-axis 252 versus T in units K along the x-axis 204 that corresponds to two simulations of the state variable T in the presence of ambient thermal noise. That is, the plot 300 corresponds to simulation of the network 100 of FIG. 1 in an environment having ambient thermal noise, and the plot 350 corresponds to simulation of the network 100 in an environment lacking ambient thermal noise. The ambient thermal noise is represented by the ambient temperature $T_{amb}$ in equation (2).

In FIGS. 3A and 3B, a first simulation has as its starting point an initial value of 300K for the state variable T, whereas a second simulation has as its starting point an initial value of 1,400 K for the state variable T. In both simulations, the applied constant bias constant $i_m$ may be one milliamp (mA). In FIG. 3A, the temperature (i.e., the state variable) T in the first simulation ultimately decreases through an unstable point 302 until it reaches the local minimum 302' of the equilibrium 206A, and the temperature T in the second simulation ultimately decreases through an unstable point 304 until it reaches the local minimum 304' of the equilibrium 206C. Therefore, the temperature T of the network 100 settles at one of the local minima in the absence of ambient thermal noise, corresponding to non-maximally optimal, local solutions to the global optimization problem to which the network 100 of FIG. 1 corresponds. The local minimum at which the temperature T settles in a simulation in the absence of ambient thermal noise depends on the initial value of this state variable when the simulation begins.

By comparison, in FIG. 3B, the temperature T in the first simulation moves through the unstable point 302 and past the equilibrium 206A until it reaches the global minimum 352 of the equilibrium 206B. Likewise, the temperature T in the second simulation moves through the unstable point 304 and past the equilibrium 206C until it reaches the global minimum 352. Therefore, the temperature of the network 100 settles at a global minimum in the presence of ambient thermal noise, corresponding to the maximally optimal global solution to the global optimization problem to which the network 100 of FIG. 1. The temperature T settles at this global minimum in a simulation in the presence of ambient thermal noise regardless of the initial value of this state variable when the simulation begins.

Figure 4:
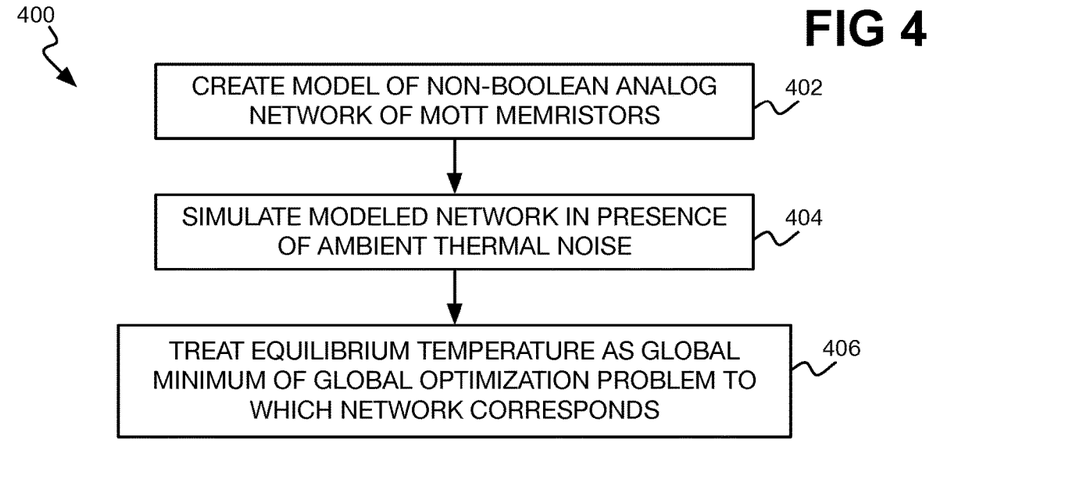
FIG. 4 is a flowchart of an example method for solving a global optimization problem via simulation of the network of FIG. 1 in the presence of ambient thermal noise.

FIG. 4 shows an example method 400 for solving a global optimization problem via simulation. The method 400 can be implemented as program code stored on a non-transitory computer-readable data storage medium and executed by a computing device having a processor and memory. The simulation can be achieved by using commercially available simulation software, or custom-developed simulation software.

A model of a non-Boolean analog network 100 of Mott memristors 102 is created (402), in correspondence with the global optimization problem, as has been described in relation to FIG. 1. As such, each memristor 102 can be modeled as a quasi-static conduction equation (1), with temperature dynamics of each memristor 102 related to electrical power dissipation and thermal properties thereof using Newton's law of cooling, per equation (2). Similarly, physical differences among the memristors 102 can be heuristically modeled using a temperature-coupled equation (3).

The modeled network 100 is simulated in the presence of ambient thermal noise from a number of different starting temperatures, until the temperature of the network 100 settles at an equilibrium temperature during simulation (404). This equilibrium temperature of the network 100 is treated as the global minimum of the global optimization problem (406), and thus as the maximally optimal global solution to the problem. In this way, the global optimization problem can be solved via simulation of a non-Boolean analog network of Mott memristors in the presence of ambient thermal noise.

Figure 5:
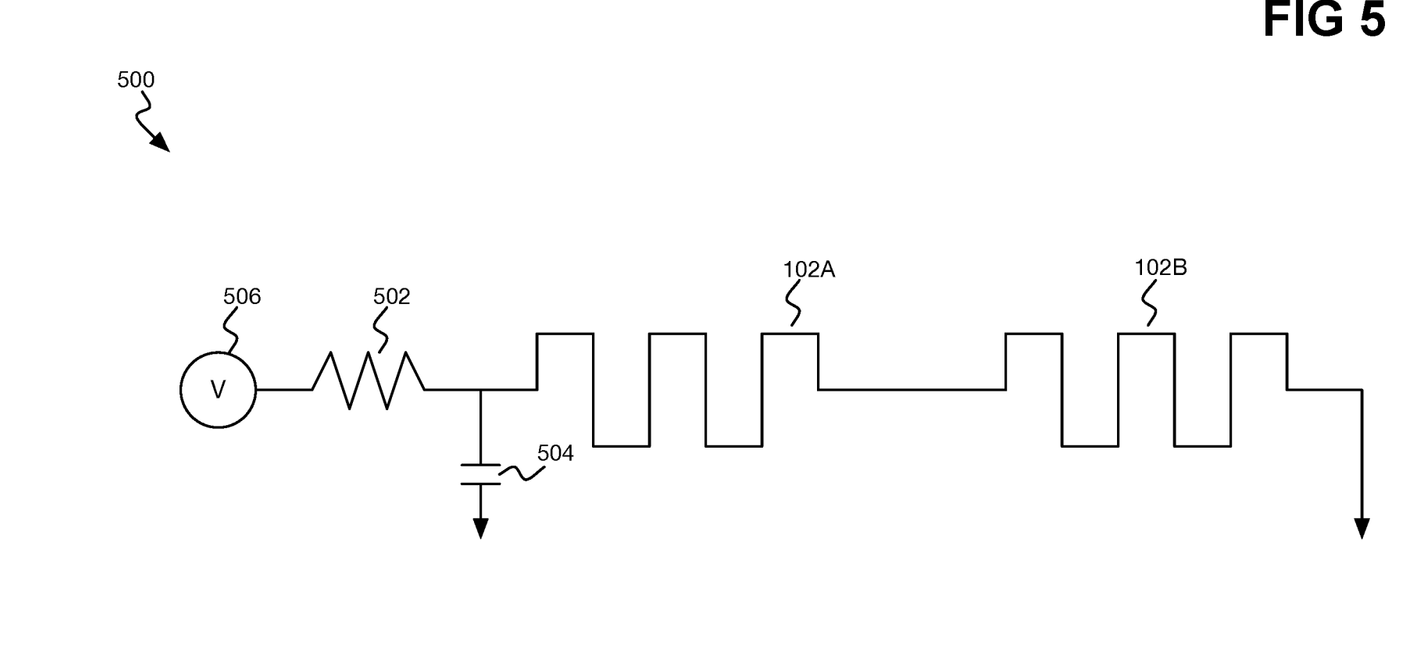
FIG. 5 is a diagram of an example system including the network of FIG. 1.

FIG. 5 shows an example system 500 including the non-Boolean analog network 100 of the Mott memristors 102 of FIG. 1. Whereas the network 100 can be created and subsequently simulated to solve a global optimization problem to which the network 100 corresponds, as has been described, the system 600 including the network 100 can be physically constructed in actuality and electrically excited to solve this problem. That is, upon construction and subsequent electrical excitation of the system 500 within an environment including ambient thermal noise, the temperature of the network 100 settles at an equilibrium temperature corresponding to a global minimum that is the maximally optimal global solution to the problem to which the network 100 corresponds.

The system 500, in addition to the network 100 of the Mott memristors 102, includes a resistor 502 in series with the network 100, as well as an intrinsic parasitic capacitance 504. The resistor 502 is more generally a resistance, and the capacitance 504 is more generally is any type of capacitance coupled to the system 500. The inclusion of the resistor 502 and the consideration of the parasitic capacitance 504 render the system 500 operable as a relaxation oscillator. The relaxation oscillator is an experimental way by which the state variable (i.e., the temperature T) of equations (1), (2), and (3) can be varied over a wide range of values, corresponding to selecting a wide range of initial values for the state variable during simulation as in the method 400 of FIG. 4.

Although the system 500 is operable as a relaxation oscillator, oscillations are suppressed when an applied voltage 506 has a value to maintain the current of the system 500 between the negative resistance regions of the memristors 102. Such oscillation suppression corresponds to the effective trapping of the network 100 at the equilibrium 206B of FIGS. 2A, 2B, 3A, and 3B, which is the global minimum of the network 100. As one example, the resistor 502 may have a resistance of 2,000 ohms (two kΩ), and a voltage 506 of about three volts (V) applied to realize a current of one mA.

Figure 6:
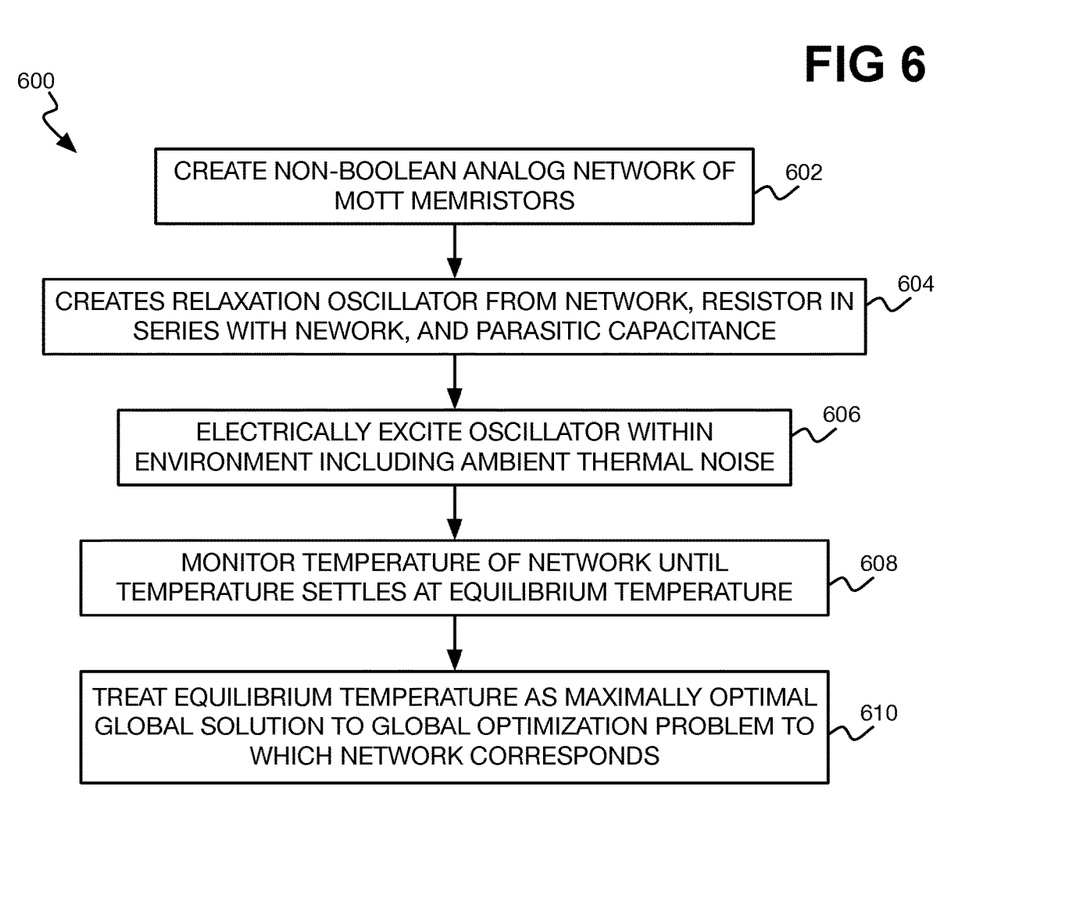
FIG. 6 is a flowchart of an example method for solving a global optimization problem via electrical excitation of the system of FIG. 5 in an environment of ambient thermal noise.

FIG. 6 shows an example method 600 for solving a global optimization problem via electrical excitation of the system 500 in an environment including ambient thermal noise. Electrical excitation in a different environment lacking ambient thermal noise does not result in a maximally optimal global solution to the problem to which the network 100 of the system 500 corresponds. This is because the absence of such ambient thermal noise results in the temperature of the network 100 settling at an equilibrium corresponding to a local minimum, as has been described, and not to the global minimum.

A non-Boolean analog network 100 of Mott memristors 102 is created in correspondence with the global optimization problem (602). A relaxation oscillator is then created from this network 100, the resistor 502 in series with the network 100, and the parasitic capacitance 504 (604). The relaxation oscillator is electrically excited with the applied voltage 506 within an environment including ambient thermal noise (606), and the temperature of the network 100 monitored until it settles at an equilibrium temperature (608). This equilibrium temperature is treated as the maximally optimal global solution to the global optimization problem (610), and thus as the global minimum of the problem. In this way, the global optimization problem can be solved via actual physical construction and electrical excitation of a non-Boolean analog network of Mott memristors in an environment including ambient thermal noise.

The techniques that have been described therefore leverage usage of a non-Boolean analog Mott memristor network to solve global optimization problems when ambient thermal noise is considered. A network 100 including two Mott memristors 102 has been specifically described, but the network 100 can be extended to more than two memristors 102 to correspond to global optimization problems that have more than two local minima. Furthermore, the usage of such a network of Mott memristors along with ambient thermal noise to solve such a problem positively differs from other approaches, such as quantum computing, because the network can be operated at room temperature to solve the problem to which the network corresponds. By comparison, quantum computing may require operation at temperatures that are near absolute zero, which results in significantly higher operational costs.

I claim:

1. A non-Boolean analog system comprising:
a first Mott memristor having a first value of a characteristic;
a second Mott memristor having a second value of the characteristic different than the first value, in series with the first Mott memristor to form a network; and
a resistance in series with the network and that, together with the network and a capacitance coupled to the system, renders the system operable as a relaxation oscillator,
wherein responsive to electrical excitation of the system within an environment including ambient thermal noise, a temperature of the network settles at an equilibrium corresponding to a global minimum that is a maximally optimal global solution to a global optimization problem to which the network corresponds.

2. The non-Boolean analog system of claim 1, wherein the global optimization problem has a plurality of local solutions that are not maximally optimal.

3. The non-Boolean analog system of claim 2, wherein responsive to the electrical excitation of the system within a different environment lacking the ambient thermal noise, the temperature of the network settles at a different equilibrium corresponding to one of the local solutions that are not maximally optimal.

4. The non-Boolean analog system of claim 1, wherein the characteristic comprises one or more of a physical characteristic and an electrical characteristic.

5. The non-Boolean analog system of claim 4, wherein the physical characteristic comprises one or more of area and size.

6. The non-Boolean analog system of claim 4, wherein the electrical characteristic comprises one or more of resistance and current at which negative differential resistance occurs.

7. The non-Boolean analog system of claim 1, wherein to reach the maximally optimal global solution, each Mott memristor is modeled as a quasi-static conduction equation in which temperature is a state variable of the equation.

8. The non-Boolean analog system of claim 7, wherein the quasi-static conduction equation comprises a modified three-dimensional Poole-Frenkel transport relation.

9. The non-Boolean analog system of claim 7, wherein to reach the maximally optimal global solution, temperature dynamics of each Mott memristor is further related to electrical power dissipation and thermal properties thereof by Newton's law of cooling.

10. The non-Boolean analog system of claim 9, wherein each Mott memristor has a plurality of Mott transitions between conductivity and non-conductivity at different temperatures,
and wherein to reach the maximally optimal global solution, physical differences between the Mott memristors are heuristically modeled using a temperature-coupled equation.

11. A method comprising:
creating in correspondence with a global optimization problem a non-Boolean analog network including a plurality of Mott memristors that have different values for a characteristic, and a capacitance, the network operable as a relaxation oscillator;
creating a relaxation oscillator from the network, a resistance in series with the network, and the capacitance;
electrically exciting the relaxation oscillator the network within an environment including ambient thermal noise;
monitoring a temperature of the network until the temperature settles at an equilibrium temperature; and
treating the equilibrium temperature of the network as a maximally optimal global solution to the global optimization problem.

12. The method of claim 11, wherein the global optimization problem has a plurality of local solutions that are not maximally optimal,
wherein electrically exciting the relaxation oscillator within a different environment lacking the ambient thermal noise causes the temperature of the network to settle at a different equilibrium temperature corresponding to a non-maximally optimal global solution to the global optimization problem.

13. The method of claim 11, wherein creating the non-Boolean analog network comprises specifying the characteristic of which each Mott memristor has a different value as one or more of: a physical size of the memristor, a physical area of the memristor, a resistance of the memristor, and a current at which negative differential resistance of the memristor occurs.

14. The method of claim 11, wherein electrically exciting the relaxation oscillator comprises applying a voltage corresponding to a current among negative differential resistance regions of the Mott memristors at which oscillation of the network is suppressed.

15. The method of claim 11, wherein the maximally optimal global solution is a global minimum of the global optimization problem.

16. A non-transitory computer-readable data storage medium storing program code that a computing device executes to:
create a model of a non-Boolean analog network of a plurality of Mott memristors that have different values for a characteristic, in correspondence with a global optimization problem;
simulate the modeled network in presence of ambient thermal noise from a plurality of different starting temperatures, until a temperature of the network settles at an equilibrium temperature; and
treat the equilibrium temperature of the network as a global minimum of the global optimization problem.

17. The non-transitory computer-readable data storage medium of claim 16, wherein the global optimization problem has a plurality of local solutions that are not maximally optimal,
wherein simulation of the modeled network within in absence of the thermal noise causes the temperature of the network to settle at a different equilibrium temperature corresponding to a local minimum of the global optimization problem.

18. The non-transitory computer-readable data storage medium of claim 16, the computing device executes the program code to the model of the network by:
modeling each memristor as a quasi-static conduction equation in which temperature is a state variable of the equation, and as having a plurality of Mott transitions between conductivity and non-conductivity at different temperatures;
relating temperature dynamics of each Mott memristor to electrical power dissipation and thermal properties thereof by Newton's law of cooling; and heuristically modeling physical differences among the Mott memristors using a temperature-coupled equation.

19. The non-transitory computer-readable data storage medium of claim 16, wherein the global minimum is a maximally optimal global solution to the global optimization problem.

* * * * *